United States Patent [19] [11] 4,027,320
Jacobs et al. [45] May 31, 1977

[54] STATIC STORAGE ELEMENT AND PROCESS FOR THE PRODUCTION THEREOF

[75] Inventors: Erwin Jacobs; Gerhard Dorda, both of Munich, Germany

[73] Assignee: Siemens Aktiengesellschaft, Berlin & Munich, Germany

[22] Filed: Sept. 25, 1975

[21] Appl. No.: 616,585

[30] Foreign Application Priority Data
Sept. 26, 1974 Germany .......................... 2446088

[52] U.S. Cl. .................................. 357/23; 357/63; 357/88; 357/91
[51] Int. Cl.² ................ H01L 29/78; H01L 29/167; H01L 29/207
[58] Field of Search .................. 357/23, 63, 88, 91

[56] References Cited
UNITED STATES PATENTS 3,852,120 12/1974 Johnson et al. ...................... 357/91
3,922,708 11/1975 Crowder et al. ...................... 357/91

OTHER PUBLICATIONS

IBM—Tech. Bul.—vol. 14, No. 4, Sept. 1971, pp. 1269–1270, Troutman.
IBM—Tech. Bul.—vol. 15, No. 10, Mar. 1973, p. 3031, Regh.

*Primary Examiner*—Edward J. Wojciechowicz
*Attorney, Agent, or Firm*—Hill, Gross, Simpson, Van Santen, Steadman, Chiara & Simpson

[57] ABSTRACT

A static storage element in a field effect transistor arrangement, has source and drain zones in a semiconductor body and a gate insulation layer provided on the surface of the semiconductor body. A spatial region having a high lattice defect or trap density is formed in the gate insulation layer for storing a quantity of charge which can be altered by electromagnetic radiation.

2 Claims, 1 Drawing Figure

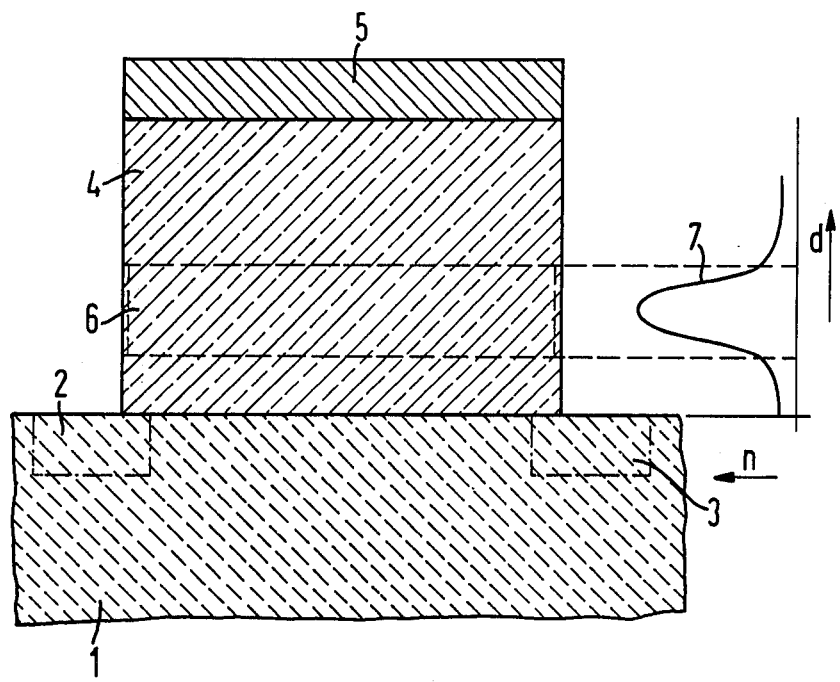

STATIC STORAGE ELEMENT AND PROCESS FOR THE PRODUCTION THEREOF

BACKGROUND OF THE INVENTION

1. Field of the Invention

The present invention relates to a storage element provided in a field effect transistor.

2. Description of the Prior Art

It has been known to provide a storage element consisting of a field effect transistor arrangement with a gate insulation layer having a plurality of layers composed of different materials. By the irradiation of electromagnetic radiation or by the connection of an electric field, it is possible to fill this element with data or erase data in the form of stored charges. Charge is stored by intercepting charge carriers, preferably electrons, in naturally existing lattice defects or traps or large density, the density being the greatest at the boundary between two insulator layers consisting of different materials. This charge storage is reversible. The data is erased by irradiating longer-wave, electromagnetic radiation for a limited period of time or by means of electric pulses. The production of such a prior art storge element is relatively expensive.

SUMMARY OF THE INVENTION

An object of the present invention is to improve upon storage elements in field effect transistors in such a manner that their production can be simplified.

The storage element of this invention is characterized by at least one spatial region possessing a large lattice defect or trap density within a zone of homogeneous material in the gate insulation layer, wherein the maximum lattice defect or trap density lies inside the region, and the surface density of the spatial region amounts to at least $10^{11}$ lattice defects or traps per cm$^2$ measured at right angles to the gate insulation layer.

Advantageously an element of this kind is constructed in such manner that the gate insulation layer consists of a homogeneous material and a spatial region is provided therein having a large lattice defect or trap density. This spatial region forms at least one layer of high density which runs parallel to the surface of the semiconductor body. Preferably the locations of equal lattice defect or trap density form flat surfaces which run parallel to the surface of the semiconductor body.

The semiconductor body preferably consists of silicon and the gate insulation layer of silicon dioxide.

A process for the production of a storage element in accordance with the invention comprises the implantation of ions into the gate insulation layer subsequently to any high-temperature processes which may be required. Ions having a "non-doping" action are used as implantation ions. Preferably, xenon ions are employed.

The advantages of the storage element in accordance with the invention and of the process in accordance with the invention are:

a. the lattic defect or trap density and the position of the lattice defects or traps in the gate insulation layer can be selected in optimal fashion by a predetermined setting of the implantation parameters (dose, depth of entrance, dopant); and b. the production process avoids the relatively expensive process steps needed to form the gate insulation layers (deposition of $Si_3N_4$ — $Al_2O_3$ — or other insulator layers and production of a Si-floating gate zone).

The storage element in accordance with the invention may be installed as a storage element in integrated MIS-circuits without additional technological outlay.

BRIEF DESCRIPTION OF THE DRAWING

The Drawing schematically illustrates a cross-sectional side view of a storage element in accordance with the invention together with a graph showing a distribution profile of the lattice defect or trap density.

DESCRIPTION OF THE PREFERRED EMBODIMENTS

In the drawing, a semiconductor body 1 which is illustrated comprised of silicon, for example. A source electrode 2 and a drain electrode 3, comprising, higher doped zones, are formed in the semiconductor body. A gate insulation layer 4 of homogeneous material such as silicon dioxide is arranged above and in contact with the semiconductor body 1. Above the gas insulation layer 4 is arranged a gate electrode 5. The gate insulation layer contains a spatial region 6 of high lattice defect or trap density outlined in broken lines. The region 6 forms a layer which runs parallel to the surface of the semiconductor body 1. The curve 7 plotted on the right-hand side of the insulation layer 4, and above the surface of the semiconductor body by a distance $d$, indicates an arbitrarily selected distribution profile of the lattice defect or trap density $n$. However, any other distribution profile is permissible. For example, the lattice defect or trap density in the region 6 can have a constant value.

The region 6 can also extend over the entire gate insulation layer 4. What is essential, however, is that the surface density of the region 6, measured at right angles to the gate insulation layer, should not fall below $10^{11}$ lattice defects or traps per cm$^2$. Here "surface density" of the region is to be understood as the density of the spatial lattice defect or trap distribution of the region projected at right angles onto a flat surface. This surface density can be measured with the aid of a capacitance measuring method, wherein the region whose surface density is to be measured is brought between two capacitor electrodes lying parallel to the flat surface, and the capacitance of this arrangement is measured. It is thus possible to deduce the electric field strength components located at right angles to the flat surface in the region corresponding to the surface density which is to be measured.

The storage element represented in the drawing can be produced such that initially the field effect transistor arrangement is produced in the usual way and the gate insulation layer is provided with a homogeneous design as, for example, a silicon dioxide layer over a silicon substrate. Following the production of this gate insulation layer and any high-temperature processes which may be required, the gate insulation layer is bombarded at right angles to the surface of the semiconductor body with non-doping ions of medium heavy or heavy elements, perferably krypton or xenon. By providing a predetermined implantation dose and implantation energy, a distribution profile of the lattice defect or trap density corresponding to the Curve 7 automatically results. Also the region of high lattice defect or trap density represents a layer which runs parallel to the semiconductor surface. When a suitable selection is made of the implantation parameters, any other desired distribution profile can be attained. It is also possible to implant a plurality of layers having high lattice defect or trap density. It would present no problems for an expert in the art, having a knowledge of this theory, to select particularly favorable implantation doses, energy and materials.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A static storage element in the form of a field effect transistor comprising:
   a. a semiconductor body with source and drain zones facing a surface thereof;
   b. a homogeneous gate insulation layer on the surface of said semiconductor body between the source and drain zones;
   c. a charge-carrier storage means positioned within the gate insulation layer spaced from and substantially parallel to the semiconductor body surface for intercepting charge carriers produced by exposure of the transistor to relatively high frequency electromagnetic radiation for storage of said charge carriers, and releasing charge carriers when the transistor is exposed to relatively low frequency electromagnetic radiation for removal of said charge carriers from the storage means; and
   d. said charge-carrier storage means comprising a region of implanted non-doping ions for producing lattice storage defects or traps for said charge carriers, said ions comprising an element selected from a group consisting of Krypton and Xenon, said region having a plane of maximum trap or defect concentration substantially parallel to and spaced from the semiconductor body surface of at least $10^{11}$ traps or defects per $cm^2$ and a boundary plane of relatively low defect or trap concentration spaced from and parallel to the boundary surface, the portion of said gate insulation layer between the boundary plane and the semiconductor body surface having planes of trap or defect concentrations substantially the same as said boundary plane of relatively low trap or defect concentration.

2. The static storage element of claim 1 in which the semiconductor body is comprised of silicon and the gate insulation layer consists of silicon dioxide.

* * * * *